(12) United States Patent
Atchison

(10) Patent No.: US 6,885,955 B1
(45) Date of Patent: Apr. 26, 2005

(54) SEMICONDUCTOR PROCESS YIELD ANALYSIS BASED ON EVALUATION OF PARAMETRIC RELATIONSHIP

(75) Inventor: Nickey Joe Atchison, Santa Cruz, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/402,774

(22) Filed: Mar. 28, 2003

(51) Int. Cl.[7] .................. G01N 37/00; G01D 18/00; G01R 31/26
(52) U.S. Cl. .................. 702/81; 702/85; 438/14
(58) Field of Search .................. 702/81, 84, 35, 702/121; 438/14, 15, 17, 18; 700/96, 109, 110

(56) References Cited

U.S. PATENT DOCUMENTS

| | | | |
|---|---|---|---|
| 6,210,983 B1 | 4/2001 | Atchison et al. | 438/14 |
| 6,324,481 B1 | 11/2001 | Atchison et al. | 702/84 |
| 6,393,602 B1 | 5/2002 | Atchison et al. | 716/4 |
| 2003/0229410 A1 * | 12/2003 | Smith et al. | 700/109 |

* cited by examiner

*Primary Examiner*—John Barlow
*Assistant Examiner*—Meagan S Walling
(74) *Attorney, Agent, or Firm*—David R. Graham

(57) ABSTRACT

Semiconductor process yield analysis in which the relationship between a wafer-level parameter and a die-level parameter is evaluated can be performed more quickly and with greater accuracy than has been the case with previous such yield analysis. The yield analysis can be performed by selecting regions of a semiconductor wafer or wafers from which parametric data is to be obtained for use in the analysis, based on one or more characteristics of the wafer (s). The yield analysis can be performed by grouping the parametric data based on both a grouping of the wafer-level parametric data and a grouping of the die-level parametric data. The yield analysis can be performed by grouping the parametric data in greater than 3 groups.

23 Claims, 6 Drawing Sheets

FIG. 4A

| | WAFER LEVEL DATA | CHIP LEVEL DATA |
|---|---|---|
| BAD | 5.4 | 10.8 |
| BAD | 5.8 | 11.6 |
| BAD | 6.3 | 12.6 |
| BAD | 6.5 | 13 |
| BAD | 7.2 | 14.4 |
| BAD | 7.6 | 15.2 |
| BAD | 8.2 | 16.4 |
| BAD | 8.5 | 17 |
| BAD | 8.8 | 17.6 |
| BAD | 9 | 18 |
| BAD | 12 | 24 |
| BAD | 13 | 26 |
| GOOD | 1 | 2 |
| GOOD | 3 | 6 |
| GOOD | 4.2 | 8.4 |
| GOOD | 4.5 | 9 |
| GOOD | 4.8 | 9.6 |
| GOOD | 5.2 | 10.4 |
| GOOD | 5.6 | 11.2 |
| GOOD | 6.1 | 12.2 |
| GOOD | 6.7 | 13.4 |
| GOOD | 6.9 | 13.8 |
| GOOD | 7.4 | 14.8 |
| GOOD | 7.8 | 15.6 |

FIG. 4B

| GROUP NUMBER | GROUP ORDER NUMBER | WAFER LEVEL DATA | CHIP LEVEL DATA | WAFER-DATA AVERAGE BY GROUP | CHIP-DATA AVERAGE BY GROUP |
|---|---|---|---|---|---|
| 1 | 1 | 1 | 2 | | |
| 1 | 2 | 3 | 6 | | |
| 1 | 3 | 4.2 | 8.4 | | |
| 1 | 4 | 4.5 | 9 | 3.175 | 6.35 |
| 2 | 1 | 4.8 | 9.6 | | |
| 2 | 2 | 5.2 | 10.4 | | |
| 2 | 3 | 5.4 | 10.8 | | |
| 2 | 4 | 5.6 | 11.2 | 5.25 | 10.5 |
| 3 | 1 | 5.8 | 11.6 | | |
| 3 | 2 | 6.1 | 12.2 | | |
| 3 | 3 | 6.3 | 12.6 | | |
| 3 | 4 | 6.5 | 13 | 6.175 | 12.35 |
| 4 | 1 | 6.7 | 13.4 | | |
| 4 | 2 | 6.9 | 13.8 | | |
| 4 | 3 | 7.2 | 14.4 | | |
| 4 | 4 | 7.4 | 14.8 | 7.05 | 14.1 |
| 5 | 1 | 7.6 | 15.2 | | |
| 5 | 2 | 7.8 | 15.6 | | |
| 5 | 3 | 8.2 | 16.4 | | |
| 5 | 4 | 8.5 | 17 | 8.025 | 16.05 |
| 6 | 1 | 8.8 | 17.6 | | |
| 6 | 2 | 9 | 18 | | |
| 6 | 3 | 12 | 24 | | |
| 6 | 4 | 13 | 26 | 10.7 | 21.4 |

SEMICONDUCTOR PROCESS YIELD ANALYSIS BASED ON EVALUATION OF PARAMETRIC RELATIONSHIP

BACKGROUND OF THE INVENTION

1. Field of the Invention

This invention relates to yield analysis of a semiconductor process and, in particular, to semiconductor process yield analysis in which the relationship between a die-level parameter and a wafer-level parameter is evaluated.

2. Related Art

Electronic devices are commonly constructed using one or more integrated circuit chips. Each integrated circuit chip is a semiconductor die that has been appropriately processed to produce desired electrical circuitry thereon. Typically, multiple semiconductor die are defined on a single semiconductor substrate ("wafer") and processed together at one time to produce multiple integrated circuit chips. The processing of a semiconductor wafer to produce integrated circuit chips is typically very complex, often involving hundreds of processing steps. Consequently, it is not uncommon for a processed wafer to include one or more die that are determined to be defective in some way and unfit for use as an integrated circuit chip in an electronic device. It is an ongoing concern of the semiconductor processing industry to increase the yield (i.e., the percentage of usable die on each processed wafer) of semiconductor process. Increasing semiconductor process yield can be facilitated by performing yield analysis that is intended to identify defect(s) produced by a semiconductor process and/or the source of defect(s) produced by a semiconductor process.

Previously, one way in which yield analysis has been accomplished is by performing parametric tests ("die-level parametric tests") on the semiconductor die that produce information regarding the performance of the die during operation of the circuitry formed thereon and performing parametric tests ("wafer-level parametric tests") at other specified test locations on the semiconductor wafer that produce information regarding the structure of the wafer and/or the function of "test electrical components" formed on the wafer, then evaluating the wafer-level parametric data and die-level parametric data to determine the nature of the relationship (e.g., the existence of a correlation) between the corresponding wafer-level parameter and die-level parameter. Die-level parametric tests can include, for example, tests to determine characteristics of die operation such as electrical noise production, power consumption, heat production, output levels, offsets and frequency responses. Wafer-level parametric tests) can include, for example, tests to determine line width, oxide layer thickness or dopant concentration. Wafer-level parametric tests can also include, for example, tests to determine the electrical characteristics (e.g., resistivity, conductivity, gain, sheet resistance, transistor beta, FET threshold voltage) of a "test electrical component" formed on a wafer. There are many types of die-level parametric tests (more than 800 commonly used types) and wafer-level parametric tests (more than 400 commonly used types), as known to those skilled in the art. As can be appreciated, then, evaluating the relationships between various pairs of wafer-level and die-level parameters can be a time-consuming task.

FIGS. 1A, 1B and 1C illustrate how die-level parametric tests and wafer-level parametric tests can be performed on a semiconductor wafer. In FIG. 1A, multiple stepper fields (a representative one of which is indicated by the numeral 101) are defined on a semiconductor wafer 100 by scribe lanes (a representative one of which is indicated by the numeral 102). (The scribe lanes 102 are sometimes referred to as "frame outline scribe lanes.") Each stepper field 101 represents an area which is processed at one time by equipment used to effect the steps in a semiconductor process. FIG. 1B shows an area of the wafer 100 in more detail. Within each stepper field 101, multiple die (a representative one of which is indicated by the numeral 103) are defined by additional scribe lanes (a representative one of which is indicated by the numeral 104). (The scribe lanes 104 are sometimes referred to as "intra-frame scribe lanes.") As can be seen in FIG. 1B, contact pads (a representative one of which is indicated by the numeral 103a) are formed on the die 103 which enable electrical connection to be made from the die 103 to testing apparatus that is used to perform die-level parametric tests. FIG. 1C shows in more detail an intersection of two scribe lanes 104 illustrated in FIG. 1B. As can be seen in FIG. 1C, electrical components (a representative one of which is indicated by the numeral 104a), such as, for example, resistors, capacitors and transistors, are formed in the scribe lanes 104. (A collection of electrical components 104a in a scribe lane or stepper field is sometimes referred to as a "scribe lane monitor.") Wafer probe apparatus can be used to perform wafer-level parametric tests on the electrical components 104a in the scribe lanes 104. (Wafer-level parametric tests can also be performed on electrical components formed in special designated areas of a semiconductor wafer.)

Previous methods of accomplishing yield analysis by evaluating wafer-level and die-level parametric data to determine the nature of the relationship between the corresponding wafer-level and die-level parameters are deficient in certain respects. For example, previously, parametric tests have been performed for all regions of a semiconductor wafer. The increased use of 12" wafers and reduced use of 6" wafers has made such an approach inordinately time consuming (e.g., as much as 20 hours per wafer); moreover, this problem is exacerbated by the typical need to perform parametric tests on multiple (e.g., 5 or more) wafers in order to evaluate parametric relationships. Additionally, testing all regions of a semiconductor wafer (and combining and averaging parametric data from all of those regions) can cause the influence of regions including bad die, which are of most use in evaluating parametric relationships, to be undesirably diluted in such evaluation, in particular to a point that causes relationships that would otherwise be identified to go unnoticed. Further, when all regions of a semiconductor wafer are tested, normally present geometric patterns in parametric values are more likely to obscure or confound relationships that would otherwise be identified.

A previous method of accomplishing yield analysis by evaluating parametric data to determine the nature of the parametric relationships has also been performed by obtaining parametric data for multiple semiconductor wafers at the same locations for each wafer. This method advantageously reduces the time required for performing the yield analysis. Parametric data is obtained at the same locations for each wafer to avoid the need to reprogram the stepper machine (i.e., the apparatus that effects testing at different locations on a wafer) to obtain parametric data for each new wafer. However, since parametric data is obtained at the same locations on each wafer, parametric data of most use in identifying parametric relationships may not be considered in the analysis, which may result in parametric relationships being overlooked that would otherwise be identified.

Previous methods of accomplishing yield analysis by evaluating the relationship between a die-level parameter and a wafer-level parameter have sometimes arranged die-level parametric data and corresponding wafer-level parametric data into groups, determined an average value of the die-level parametric data and corresponding wafer-level parametric data for each group, then used the average values to evaluate the relationship between the die-level parameter and wafer-level parameter exists. Such previous methods have grouped the parametric data into 3 groups. However, the use of 3 groups may not provide a sufficiently detailed summary of the parametric data to enable adequate evaluation of the nature of the relationship between two parameters, e.g., may not provide enough data values to produce a sufficiently accurate curve fit representing the expected relationship between two parameters.

Additionally, a previous such method of accomplishing yield analysis has discarded extreme values (high and/or low) of the parametric data before arranging the die-level parametric data and corresponding wafer-level parametric data into groups. However, such filtering of the parametric data may disadvantageously discard parametric data than can be important in accurately evaluating the relationship between a die-level parameter and a wafer-level parameter.

Finally, previous methods of accomplishing yield analysis by evaluating the relationship between a die-level parameter and a wafer-level parameter based on a grouping of the parametric data have been implemented using a single grouping of the parametric data (the parametric data are arranged into groups based on the values of the wafer-level parametric data). The use of a single grouping of the parametric data in evaluating the relationship between a die-level parameter and a wafer-level parameter may sometimes produce misleading results, e.g., may result in a "false-positive" indication of a correlation between the die-level parameter and the wafer-level parameter.

SUMMARY OF THE INVENTION

According to the invention, semiconductor process yield analysis in which the relationship between a wafer-level parameter and a die-level parameter is evaluated can be performed more quickly and with greater accuracy than has been the case with previous such yield analysis. As integrated circuit chips become more complex, the reduced time requirements and increased accuracy of yield analysis in accordance with the invention are increasingly important.

In one embodiment of the invention, a method of semiconductor process yield analysis includes the steps of: 1) selecting, based on one or more characteristics of one or more semiconductor wafers on which the semiconductor process is performed, one or more regions of the wafer(s), which regions together comprise less than all of the wafer(s), from which to use wafer-level parametric data regarding a wafer-level parameter and die-level parametric data regarding a die-level parameter to ascertain information regarding the relationship between the wafer-level parameter and the die-level parameter; 2) identifying wafer-level parametric data; 3) identifying die-level parametric data that correspond to the wafer-level parametric data; and 4) evaluating the wafer-level parametric data and the die-level parametric data to ascertain information regarding the relationship between the wafer-level parameter and the die-level parameter. The selection of a subset of wafer regions from which to obtain parametric data can advantageously enable yield analysis to be performed more quickly than has been the case with yield analysis methods in which parametric data is obtained from all of the test wafers. The selection of wafer region(s) can be based on wafer sort data produced by one or more wafer sort tests performed on the wafer(s). In particular, the invention can be implemented so that only wafer region(s) having a sufficiently poor performance on one or more wafer sort tests and wafer region(s) having a sufficiently good performance on one or more wafer sort tests are selected from which to use parametric data in the yield analysis. The selection of such wafer regions can advantageously increase the accuracy of yield analysis of a semiconductor process by reducing "noise" in the parametric data and reducing the likelihood of occurrence of spurious correlations.

In another embodiment of the invention, a method of semiconductor process yield analysis includes the steps of: 1) identifying wafer-level parametric data regarding a wafer-level parameter; 2) identifying die-level parametric data regarding a die-level parameter that correspond to the wafer-level parametric data; and 3) evaluating the wafer-level parametric data and the die-level parametric data to ascertain information regarding the relationship between the wafer-level parameter and the die-level parameter, based on i) an evaluation of the representative values of groups of wafer-level parametric data (the groups being determined based on the values of the wafer-level parametric data) and groups of die-level parametric data that include die-level parametric data corresponding to a group of the wafer-level parametric data and ii) an evaluation of the representative values of groups of die-level parametric data (the groups being determined based on the values of the die-level parametric data) and groups of wafer-level parametric data that include wafer-level parametric data corresponding to a group of the die-level parametric data. The use of a second grouping of the parametric data to evaluate the relationship between two parameters increases the confidence in the results of the analysis.

In yet another embodiment of the invention, a method of semiconductor process yield analysis includes the steps of: 1) identifying wafer-level parametric data regarding a wafer-level parameter; 2) identifying die-level parametric data regarding a die-level parameter that correspond to the wafer-level parametric data; and 3) evaluating the wafer-level parametric data and the die-level parametric data to ascertain information regarding the relationship between the wafer-level parameter and the die-level parameter, based on an evaluation of the representative values of greater than 3 corresponding groups of wafer-level parametric data and die-level parametric data. The parametric data can be arranged into, for example, 6 or 9 corresponding groups of wafer-level parametric data and die-level parametric data. The use of a greater number of groups of parametric data provides a more detailed summary of the parametric data that enables better evaluation of the nature of the relationship between two parameters, e.g., provides enough data values to produce a sufficiently accurate curve fit representing the expected relationship between two parameters.

In still another embodiment of the invention, a method of semiconductor process yield analysis includes the steps of: 1) identifying wafer-level parametric data regarding a wafer-level parameter; 2) identifying die-level parametric data regarding a die-level parameter that correspond to the wafer-level parametric data; and 3) evaluating all of the identified wafer-level parametric data and the identified die-level parametric data to ascertain information regarding the relationship between the wafer-level parameter and the die-level parameter. The use of all of the parametric data (rather than filtering of the parametric data as in previous yield analysis methods) avoids inaccuracies in evaluation of the relationship between a die-level parameter and a wafer-level parameter that may arise from discarding parametric data.

BRIEF DESCRIPTION OF THE DRAWINGS

FIG. 4A is a table of wafer-level parametric data and die-level parametric data that is identified for use in a yield analysis method according to the invention.

FIG. 4B is a table of wafer-level parametric data and die-level parametric data that has been assigned to groups of wafer-level parametric data and die-level parametric data, and average wafer-level parametric data and die-level parametric data values that have been calculated for each of the groups.

DETAILED DESCRIPTION OF THE INVENTION

Figure 1A:
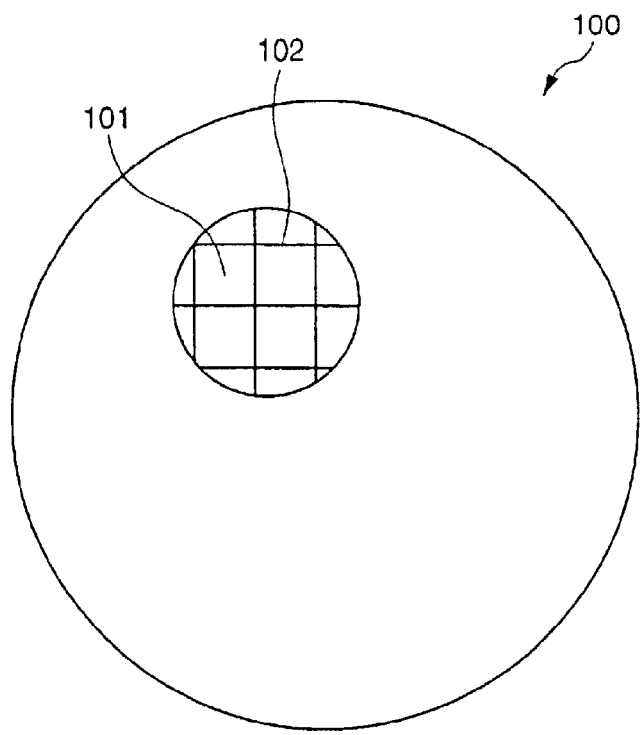
FIG. 1A is a plan view of a semiconductor wafer, illustrating multiple stepper fields defined on the wafer by scribe lanes.
Figure 1B:
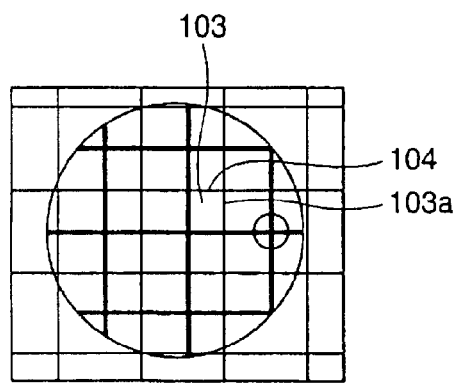
FIG. 1B is a plan view of a section of the semiconductor wafer of FIG. 1A, illustrating multiple die defined in a stepper field by scribe lanes.
Figure 1C:
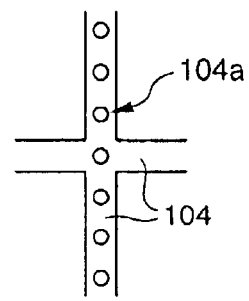
FIG. 1C is a plan of part of the section of semiconductor wafer of FIG. 1B, illustrating scribe lanes in which scribe lane monitors are formed.

In accordance with the invention, semiconductor process yield analysis in which the relationship between a wafer-level parameter and a die-level parameter is evaluated is performed in a manner which enables the yield analysis to be performed more quickly and with greater accuracy than has been the case with previous such yield analysis. The invention can advantageously be implemented to be performed in real-time, i.e., during performance of the semiconductor process being analyzed.

According to one aspect of the invention, such yield analysis is performed by selecting regions of a semiconductor wafer or wafers from which parametric data is to be obtained for use in the analysis, based on one or more characteristics of the wafer(s), e.g., based on wafer sort data obtained regarding the wafer(s). This aspect of the invention can advantageously enable yield analysis to be performed more quickly than has been the case with yield analysis methods in which parametric data is obtained from all of the test wafers. In particular, the invention can be implemented so that only bad wafer region(s) (e.g., wafer region(s) having a sufficiently poor performance on one or more wafer sort tests) and good wafer region(s) (e.g., wafer region(s) having a sufficiently good performance on one or more wafer sort tests) are selected from which to use parametric data in the yield analysis. The selection of bad and good wafer regions can advantageously increase the accuracy of yield analysis of a semiconductor process by reducing "noise" in the parametric data and reducing the likelihood of occurrence of spurious correlations.

According to another aspect of the invention, the nature of the relationship between a wafer-level parameter and a die-level parameter can be evaluated based not only on a primary grouping of the wafer-level parametric data (and dependent grouping of the die-level parametric data), but also a primary grouping of the die-level parametric data (and dependent grouping of the wafer-level parametric data). The use of a second grouping of the parametric data to evaluate the relationship between two parameters increases the confidence in the results of the analysis by providing a check on the results obtained using the first grouping of the parametric data.

According to yet another aspect of the invention, yield analysis in which wafer-level parametric data and corresponding die-level parametric data are evaluated to determine the nature of parametric relationships can be implemented so that the parametric data are arranged into a greater number of groups than has been used in previous such yield analysis. In particular, the parametric data can be arranged into greater than 3 (e.g., 6 or 9) groups. The use of a greater number of groups of parametric data provides a more detailed summary of the parametric data than enables better evaluation of the nature of the relationship between two parameters, e.g., provides enough data values to produce a sufficiently accurate curve fit representing the expected relationship between two parameters.

According to still another aspect of the invention, yield analysis in which wafer-level parametric data and corresponding die-level parametric data are evaluated to determine the nature of parametric relationships can be implemented so that none of the parametric data is discarded prior to the evaluation. The use of all of the parametric data (rather than filtering of the parametric data as in previous yield analysis methods) avoids inaccuracies in evaluation of the relationship between a die-level parameter and a wafer-level parameter that may arise from discarding parametric data.

Figure 2:
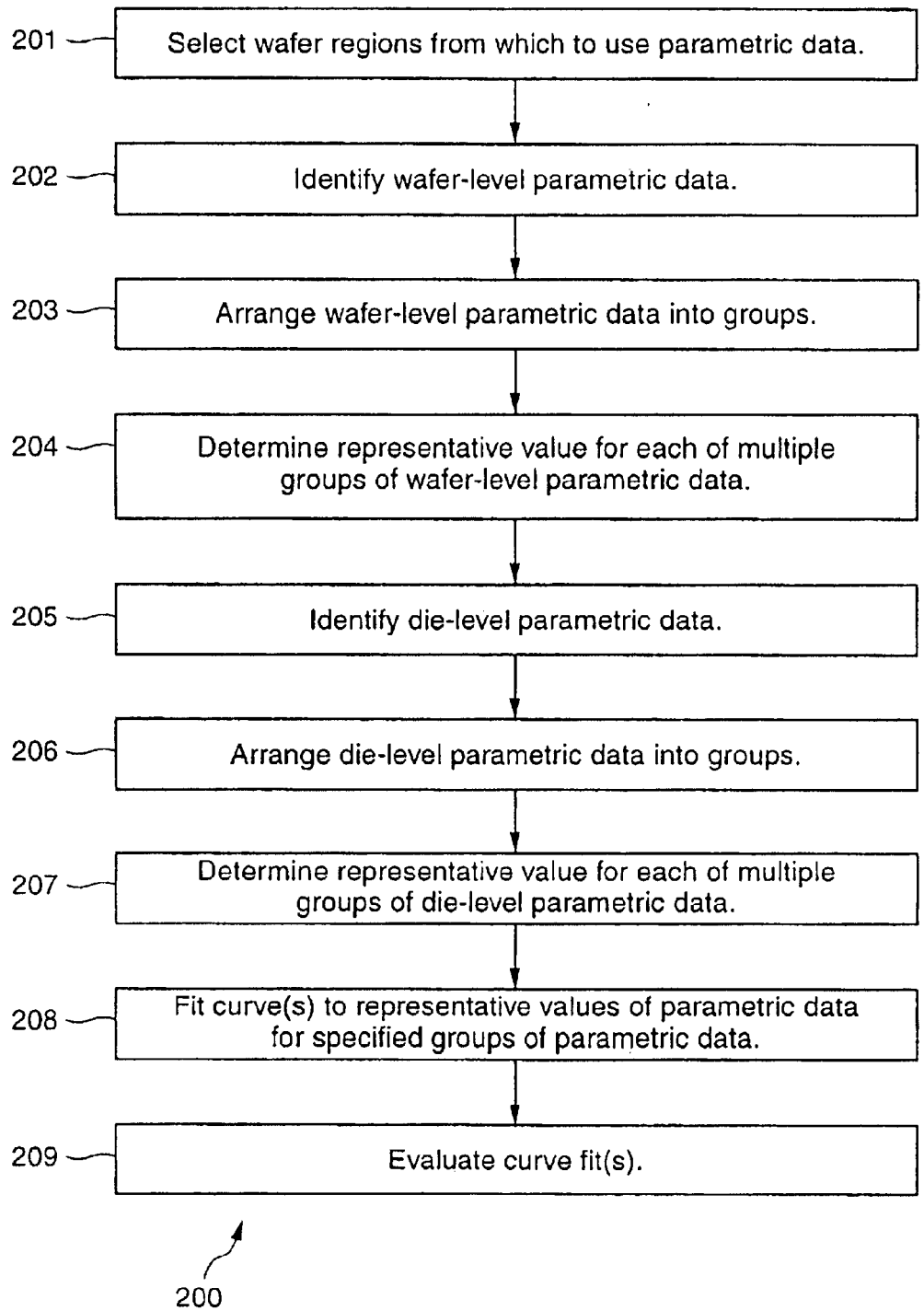
FIG. 2 is a flow chart of a method, according to an embodiment of the invention, of analyzing the yield characteristics of a semiconductor process.

FIG. 2 is a flow chart of a method 200, according to an embodiment of the invention, of analyzing the yield characteristics of a semiconductor process. As discussed further below, the method 200 can be implemented to not include one or more of the steps illustrated in FIG. 2, thereby producing methods according to other embodiments of the invention. Additionally, as also discussed further below, various steps of the method 200 (or a method produced by eliminating one or more steps from the method 200) can be implemented in more than one way, producing various embodiments of the invention. Further, as will be better appreciated from the description below of the method 200, the steps of the method 200 need not necessarily be performed in the order shown in FIG. 2 and multiple steps of the method 200 can be combined into a single step. For example, step 205 could be performed after step 202 and before, step 203. Or, step 205 could be combined with step 202. Similarly, step 204 could be performed just before step 207 or combined with that step. Other such modifications to the method 200 are possible, as can readily be understood in view of the description of the method 200 herein.

Prior to performance of the steps of the method 200, a wafer-level parameter and a die-level parameter are selected for evaluation. The steps of the method 200 use parametric data obtained from one or more semiconductor wafers to determine the nature of the relationship between the selected wafer-level parameter and die-level parameter, e.g., test for sensitivity of the die-level parameter to changes in the wafer-level parameter. The method 200 can be used generally to evaluate the relationship between any wafer-level parameter and any die-level parameter.

In step 201 of the method 200, wafer regions are selected from which parametric data is to be used in the evaluation of the relationship between the wafer-level parameter and the die-level parameter. (In some embodiments of the invention, this step of the method 200 is not performed.) In particular, the selection of wafer regions can result in at least wafer-level parametric data being obtained from less than all of the wafer or wafers which are tested for use in the yield analysis. Thus, an advantageous aspect of embodiments of the invention including the step 201 is that such embodiments can enable yield analysis to be performed more quickly than has been the case with yield analysis methods in which parametric data is obtained from all of the test wafers.

The selection of wafer regions for use in yield analysis according to the invention can be based on one or more characteristics of the wafer or wafers from which wafer regions are to be selected. For example, the selection of wafer regions can be based on wafer sort data that is obtained prior to the method 200 by performing one or more wafer sort tests (which typically are die-level parametric tests).

In one implementation of the invention, wafer regions (e.g., stepper fields) that include one or more die that performed sufficiently poorly on one or more wafer sort tests (such regions are sometimes referred to herein as "bad wafer regions") are selected together with wafer regions) e.g., stepper fields) that include one or more die that performed sufficiently well on one or more wafer sort tests (such regions are sometimes referred to herein as "good wafer regions"). (Typically, the same wafer sort tests are used to determine bad and good wafer regions). In a particular embodiment of such an implementation, a specified number of bad wafer regions are selected that performed the worst on one or more wafer sort tests and the same number of good wafer regions are selected that performed the best on one or more wafer sort tests. In an alternative particular embodiment of such an implementation, all wafer regions are selected that performed at worse than a specified level on one or more wafer sort tests (e.g., outside of, or more than a specified amount outside of, the specification limits for the wafer sort test(s), or greater than some multiple of the standard deviation of the data for a wafer sort test from the mean value of the data for that wafer sort test) and the same number of good wafer regions are selected that performed the best on one or more wafer sort tests. In yet another alternative particular embodiment of such an implementation, all wafer regions are selected that performed at worse than a specified level on one or more wafer sort tests (e.g., as discussed above) and all wafer regions are selected that performed at better than a specified level on one or more wafer sort tests (e.g., having a wafer sort test value within a specified fraction, such as one-third, of the values in the middle of the wafer sort test specification, or less than some multiple of the standard deviation of the data for a wafer sort test from the mean value of the data for that wafer sort test). (In the first two particular embodiments described above, the same number of bad and good wafer regions are selected, while in the third particular embodiment described above, different numbers of bad and good wafer regions may be selected).

Figure 3A:
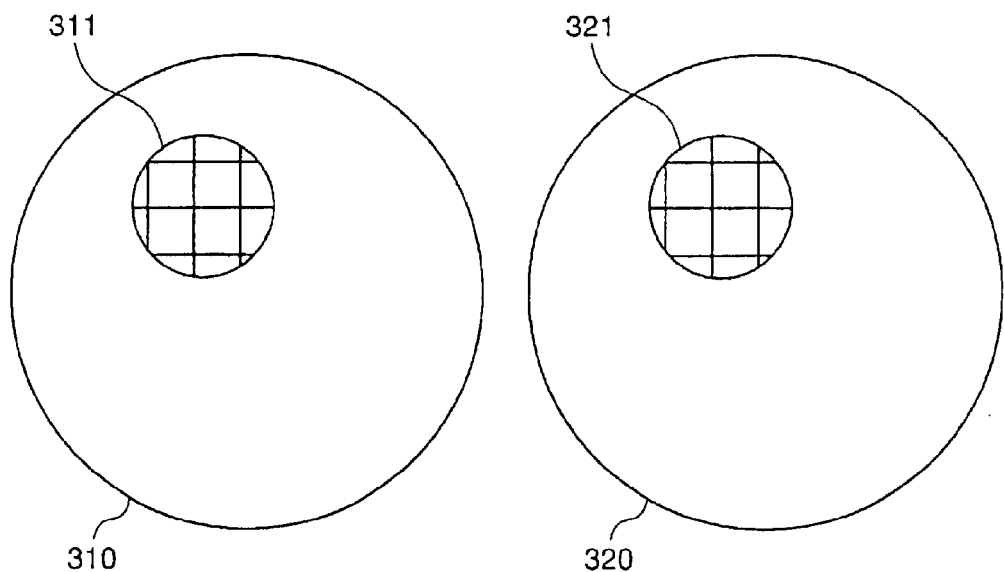
FIG. 3A is a plan view of two semiconductor wafers, illustrating corresponding regions of the semiconductor wafers from which parametric data can be used in a method according to the invention of analyzing the yield characteristics of a semiconductor process.
Figure 3B:
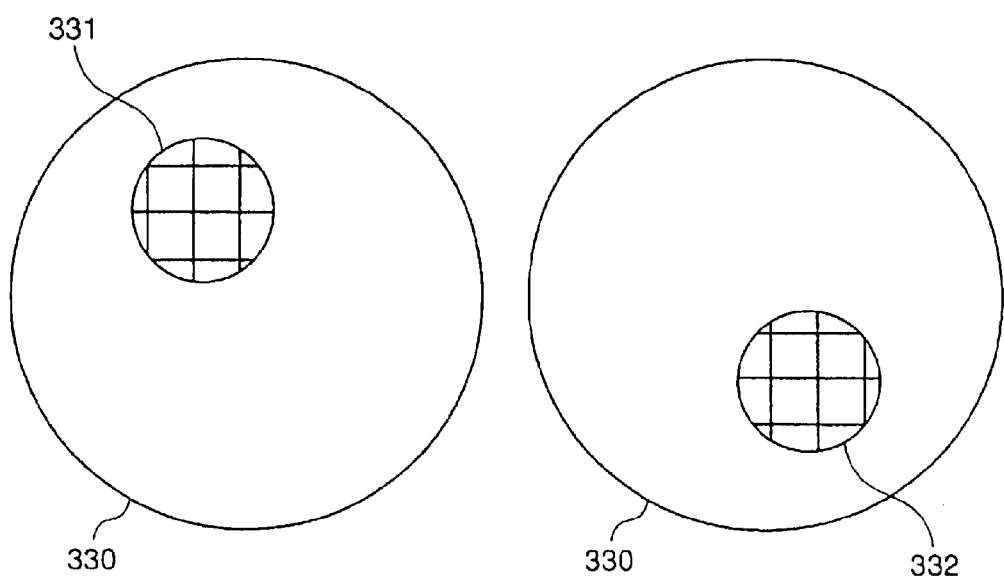
FIG. 3B is a plan view of a semiconductor wafer, illustrating mirror wafer regions of the semiconductor wafer from which parametric data can be used in a method according to the invention of analyzing the yield characteristics of a semiconductor process.

In another implementation of the invention, wafer regions (e.g., stepper fields) that include one or more die that performed sufficiently poorly on one or more wafer sort tests (again, such regions are sometimes referred to herein as "bad wafer regions") are selected together with "corresponding" wafer regions (e.g., stepper fields) that include one or more die that performed sufficiently well on one or more wafer sort tests (such regions are also sometimes referred to herein as "good wafer regions"). (In this implementation of the invention, the selected wafer regions include an equal number of good and bad wafer regions). In this implementation of the invention, "performing sufficiently poorly" can mean that the performance of the one or more die in a region is outside of established specification limits for the one or more wafer sort tests. Alternatively, "performing sufficiently poorly" can mean that the performance of the one or more die in a region is worse than a specified level for the one or more wafer sort tests. Similarly, in this implementation of the invention, "performing sufficiently well" can mean that the performance of the one or more die in a region is within established specification limits for the one or more wafer sort tests. Alternatively, "performing sufficiently well" can mean that the performance of the one or more die in a region is better than a specified level for the one or more wafer sort tests. A "corresponding" wafer region can be on a different wafer or the same wafer. For example, when multiple wafers are used to obtain parametric data for use in yield analysis according to the invention, the selection of a good wafer region corresponding to a bad wafer region can be accomplished by selecting a good wafer region on a different wafer from that on which the bad region is located, the good wafer being located at the same location on the new wafer as that of the bad wafer region on the original wafer. FIG. 3A is a plan view of two semiconductor wafers 310 and 320, illustrating a "bad wafer" (wafer 310) including a bad wafer region 311 and a "good wafer" (wafer 320) including a good wafer region 321 from which parametric data can be used in a yield analysis method according to the invention. The selection of a good wafer region corresponding to a bad wafer region can also be accomplished by selecting a good wafer region that is located on the same wafer as the bad wafer region at a location on the wafer that is diametrically opposite the location of the bad wafer region. (Such regions are sometimes referred to herein as "mirror wafer regions.") FIG. 3B is two plan views of a semiconductor wafer 330, illustrating mirror wafer regions 331 and 332 of the semiconductor wafer 330 from which parametric data can be used in a yield analysis method according to the invention. In a particular embodiment of this implementation of the invention, for each bad wafer region, a good wafer region is selected from a wafer different from the bad wafer at the same location as that at which the bad wafer region is located on the bad wafer; if no such wafers exist, then a good wafer region is selected as the mirror wafer region on the same bad wafer. (Further selection criteria can be specified to select a good wafer region if the mirror wafer region is also a bad wafer region. For example, wafer regions that are the same distance from the center of the wafer as the good wafer region can be evaluated and a good wafer region selected.)

The selection of bad and good wafer regions as described above can advantageously increase the accuracy of yield analysis of a semiconductor process. Since an equal or nearly equal number of bad and good wafer regions are used in the analysis, the influence of bad wafer regions, which are of most used in evaluating parametric relationships, is not overwhelmed by data from good wafer regions. Further, since the extremes of wafer performance are culled for used in the analysis, the "noise" represented by parametric data from wafer regions between the extremes is reduced. For example, spurious correlations caused by normally present geometric patterns in parametric values (such as radial distributions of parametric values) are less likely to arise.

In step 202 of the method 200, data regarding the selected wafer-level parameter that is to be used in the yield analysis is identified. (See FIG. 4A and associated description below). The method 200 can be implemented so that previously obtained wafer-level parametric data is used, such data being accessed in the step 202. This can be the case whether parametric data is used from the entire wafer or wafers from which parametric data is obtained or only part (e.g., from wafer regions selected as described above with respect to the step 201). The method 201 can also be implemented so that the wafer-level parametric data is obtained in the step 202 by performing the corresponding wafer-level parametric test at specified test locations on the wafer(s). In particular, when the method 200 includes the step 201, in which wafer regions are selected from which parametric data is to be used in the yield analysis, the step 202 can advantageously be implemented so that the wafer-level parametric data is obtained only from the selected wafer regions, thus enabling the yield analysis to be performed more quickly than would be the case if wafer-level parametric data was obtained from all of the wafer(s).

In step 203 of the method 200, the wafer-level parametric data is arranged in groups. (See FIG. 4B and associated description below). In one implementation of the invention, the wafer-level parametric data is arranged into a specified number of groups that each include the same amount of wafer-level parametric data. (Depending on the number of groups and the amount of wafer-level parametric data, one or more groups may include one more piece of data than one or more other groups). The invention can be implemented so that the wafer-level parametric data is arranged in groups by ordering the wafer-level parametric data in increasing or decreasing order, then successively assigning an appropriate amount of the data to each group.

In particular, the invention can be implemented so that more than 3 groups are used, i.e., more than have been used in previous methods of yield analysis in which parametric data is arranged into groups as part of the analysis. The use of a greater number of groups of parametric data enables better evaluation of the nature of the relationship between two parameters. For example, the use of a greater number of groups provides enough data values to produce a sufficiently accurate curve fit representing the expected relationship between two parameters (for instance, process "cliffs" may be more likely to appear in the curve fit). In one particular implementation of the invention, 6 groups are used. In another particular implementation of the invention, 9 groups are used. As indicated above, in some embodiments of a yield analysis method according to the invention, one or more steps are eliminated from the method 200. When, for example, the method 200 is implemented so that parametric data is grouped into more than 3 groups, the step 201, in which wafer regions are selected from which parametric data is to be used in the yield analysis, need not necessarily be performed (though, for the reasons discussed above, the performance of such step can be advantageous). Conversely, when the method 200 is implemented to include the step 201, the parametric data can be grouped into 3 groups.

In step 204 of the method 200, a representative value is determined for each of multiple groups of wafer-level parametric data. (See FIG. 4B and associated description below.) The representative value can be an average or a median of the wafer-level parametric data in the group. A representative value need not necessarily be determined for all groups of wafer-level parametric data if, for example, less than all of the groups will be used to evaluate the relationship between the wafer-level parameter and the die-level parameter. The use of representative values of groups of parametric data to perform the yield analysis according to the invention reduces the "noise" in the parametric data that may otherwise obstruct the analysis.

In step 205 of the method 200, data regarding the selected die-level parameter that is to be used in the yield analysis is identified. (See FIG. 4A and associated description below.) Typically, the method 200 is implemented so that previously obtained die-level parametric data is used, such data being accessed in the step 205. However, the method 200 can also be implemented so that the die-level parametric data is obtained in the step 205 by performing the corresponding die-level parametric test on semiconductor die formed on the wafer(s). The die-level parametric data is obtained such that each of the die-level parametric data concern a die (or a location on a die) that is located on the semiconductor wafer proximate to a scribe monitor location at which wafer-level parametric data is obtained, so that each of the die-level parametric data is associated with a corresponding piece of the wafer-level parametric data.

In step 206 of the method 200, the die-level parametric data is arranged into the same number of groups as that into which the wafer-level parametric data was arranged. (See FIG. 4B and associated description below.) Each group of die-level parametric data includes the die-level parametric data that corresponds to the wafer-level parametric data of one of the groups of wafer-level parametric data.

In step 207 of the method 200, a representative value is determined for each of multiple groups of die-level parametric data. (See FIG. 4B and associated description below. The description above with respect to the step 204 also applies to the step 207.

In step 208 of the method 200, a curve is fit to the data represented by the representative values of the wafer-level parametric data and die-level parametric data for each of specified groups of the parametric data. (See FIGS. 4C and 4D and associated description below.) The curve fit can be determined using techniques known to those skilled in that art. In one implementation of the invention, the best-fit straight line through the representative values is determined. The curve fit can be determined using representative values from less than all of the groups of parametric data created in steps 203 and 206. For example, if the invention is implemented so that the wafer-level parametric data and die-level parametric data are arranged into 9 groups, a curve can be fit to the data represented by the representative values of the middle 3 groups, the middle 5 groups, the middle 7 groups or the middle 9 groups (middle being determined with respect to the magnitudes of the representative wafer-level parametric values). The invention can also be implemented so that multiple curve fits are produced for different numbers and/or combinations of groups. Producing multiple curve fits can provide additional bases for evaluating the nature of the relationship between a wafer-level parameter and a die-level parameter, thereby increasing confidence in the results of the yield analysis.

In step 209 of the method 200, each curve fit determined in step 208 is evaluated. (See FIG. 4D and associated description below.) For example, the curve fit can be evaluated to determine whether the die-level parameter exhibits sensitivity to changes in the wafer-level parameter: if the curve is flat, then changes in the wafer-level parameter have no effect on the die-level parameter; however, as the curve becomes increasingly steep, the die-level parameter is demonstrated to be increasingly sensitive to changes in the wafer-level parameter. Additionally, the curve fit can be evaluated to determine whether values of the wafer-level parameter on the curve that lie within the wafer-level specification limits cause the value of the die-level parameter to lie outside of the die-level specification limits, i.e., would cause failure of a region of the wafer having such values of the wafer-level parameter. This can done by superimposing an "operating window" defined by the parameter design specification limits for the wafer-level and die-level parameters over a curve fit determined in step 208.

Figure 4C:
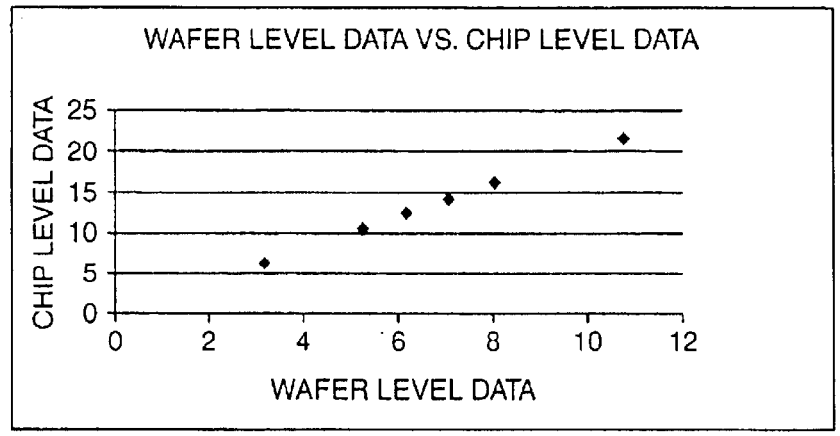
FIG. 4C is a graph of average wafer-level parametric data values and average die-level parametric data values for the groups of wafer-level parametric data and die-level parametric data in FIG. 4B.
Figure 4D:
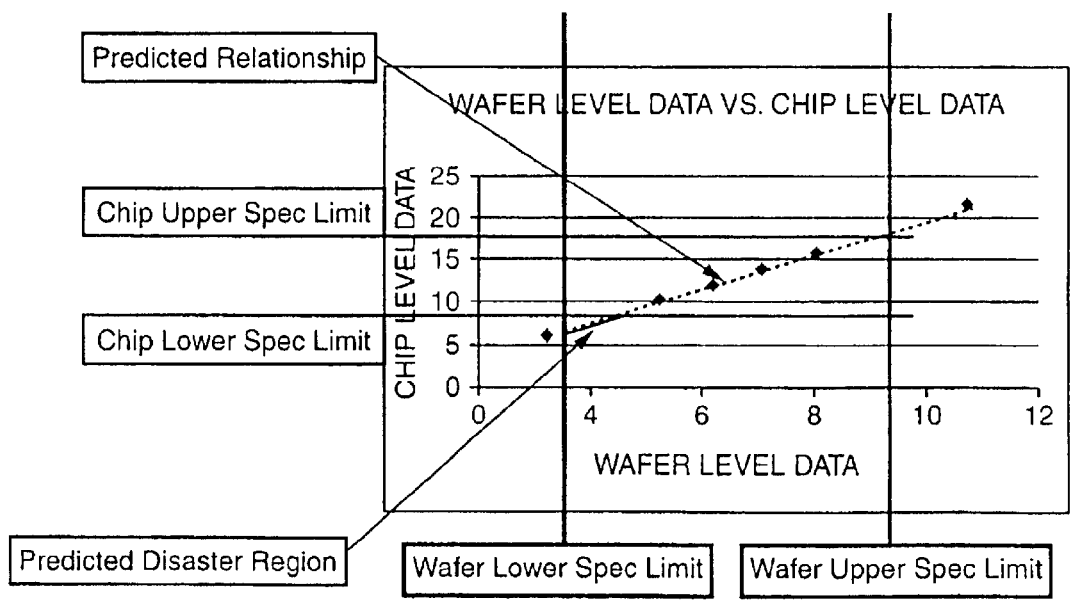
FIG. 4D is the graph of the FIG. 4C with a curve fit to the average wafer-level parametric data and die-level parametric data values and an operating window superimposed on the graph.

FIGS. 4A through 4D illustrate operation of a yield analysis method according to the invention, such as the method 200. FIG. 4A is a table of wafer-level parametric data ("Wafer Level Data" in FIG. 4A) and die-level parametric data ("Chip Level Data" in FIG. 4A) that is identified for use in the yield analysis method (e.g., steps 202 and 205 of the method 200). As illustrated in FIG. 4A, the wafer-level parametric data and die-level parametric data are obtained from an equal number of bad and good wafer regions (which can include one or multiple bad regions and one or multiple good regions). The wafer-level parametric data and die-level parametric data can be associated in pairs, the wafer-level parametric data in a pair being obtained from a scribe lane monitor that is proximate on the wafer to the die from which the die-level parametric data in the pair is obtained. FIG. 4B is a table of wafer-level parametric data and die-level parametric data that has been arranged in order of increasing magnitude of the wafer-level parametric data values and assigned to groups of wafer-level parametric data and die-level parametric data (e.g., steps 203 and 206 of the method 200), and average wafer-level parametric data values and average die-level parametric data values that have been calculated for each of the groups of wafer-level parametric data and die-level parametric data (e.g., steps 204 and 207 of the method 200). Each of the groups of wafer-level parametric data and die-level parametric data include the same amount of data. As illustrated in FIG. 4B, 6 groups of wafer-level parametric data and die-level parametric data are used in the yield analysis. FIG. 4C is a graph of average wafer-level parametric data values and average die-level parametric data values for the groups of wafer-level parametric data and die-level parametric data in FIG. 4B. FIG. 4D is the graph of FIG. 4C with a curve fit to the average wafer-level parametric data and die-level parametric data values ("Predicted Relationship" in FIG. 4D) and an operating window (defined by the parameter design specification limits for the wafer-level and die-level parameters) superimposed on the graph (e.g., steps 208 and 209 of the method 200). As can be seen, the die-level parameter does exhibit sensitivity to the wafer-level parameter. Additionally, by considering the values of the wafer-level parameter on the curve between the wafer-level parameter specification limits, it can be predicted that values of the wafer-level parameter near the lower wafer-level parameter specification limit will cause the value of the die-level parameter to fall below the lower die-level parameter specification limit (as indicated by "Predicted Disaster Region" in FIG. 4D), i.e., will cause failure of a region of the wafer having that value of the wafer-level parameter.

The invention can advantageously be implemented so that the evaluation of the relationship between a die-level parameter and a wafer-level parameter can encompass not only an evaluation of the relationship between the die-level parameter and wafer-level parameter based on a primary grouping of the wafer-level parametric data (and dependent grouping of the die-level parametric data), as in the method 200 discussed above, but also an evaluation of the relationship between the die-level parameter and wafer-level parameter based on a primary grouping of the die-level parametric data (and dependent grouping of the wafer-level parametric data), as in the method 500 discussed below. Evaluation of the relationship between a die-level parameter and a wafer-level parameter based on both a primary grouping of the wafer-level parametric data and a primary grouping of the die-level parametric data increases the confidence in the results of the analysis by providing a check on the results obtained using only one grouping of the parametric data.

Figure 5:
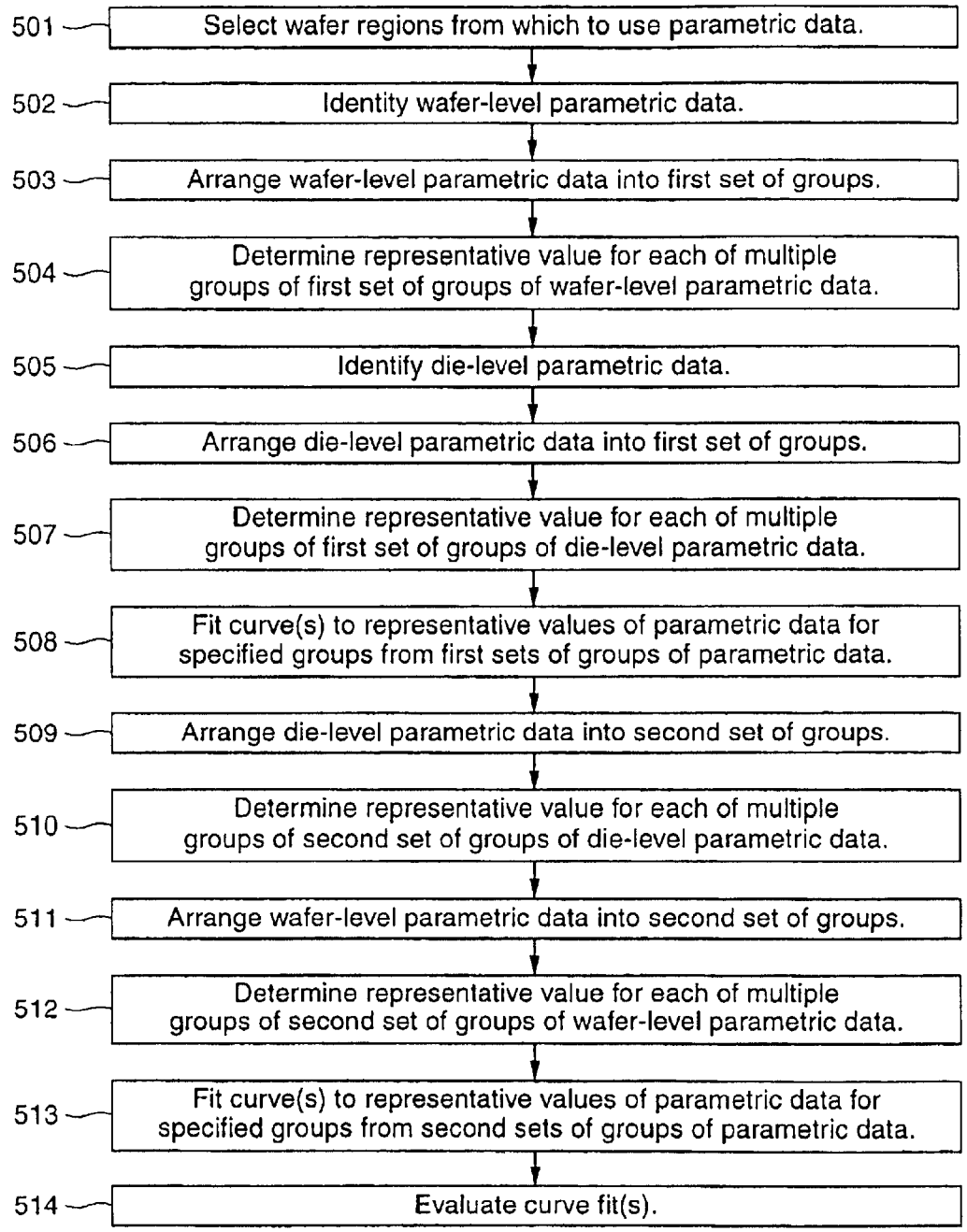
FIG. 5 is a flow chart of a method, according to another embodiment of the invention, of analyzing the yield characteristics of a semiconductor process.

FIG. 5 is a flow chart of a method 500, according to another embodiment of the invention, of analyzing the yield characteristics of a semiconductor process. Like the method 200 discussed above and illustrated in FIG. 2, the method 500 can be implemented to not include one or more of the steps illustrated in FIG. 5, thereby producing methods according to other embodiments of the invention, as discussed further below. Additionally, as also discussed further below, various steps of the method 500 (or a method produced by eliminating one or more steps from the method 500) can be implemented in more than one way, producing still further embodiments of the invention.

As for the method 200, prior to performance of the steps of the method 500, a wafer-level parameter and a die-level parameter are selected for evaluation. Also as for the method 200, the method 500 can be used generally to evaluate the relationship between any wafer-level parameter and any die-level parameter.

The steps 501 through 508 can be implemented as described above with respect to the corresponding steps 201 through 208 of the method 200. As indicated above, in some embodiments of a yield analysis method according to the invention, one or more steps are eliminated from the method 500. For example, the step 501, in which wafer regions are selected from which parametric data is to be used in the yield analysis, need no necessarily be performed (though, for the reasons discussed above, the performance of such step can be advantageous).

In step 509 of the method 500, the die-level parametric data is arranged in groups. The die-level parametric data can be arranged in groups in the same manner as the wafer-level parametric data is arranged into groups in step 503: the die-level parametric data can be arranged into a specified number of groups that each include the same amount of wafer-level parametric data and the die-level parametric data can be arranged in groups by ordering the die-level parametric data in increasing or decreasing order, then successively assigning an appropriate amount of the data to each group. Further, as with the grouping of wafer-level parametric data, the die-level parametric data can be arranged in more than 3 groups (e.g., 6 or 9 groups). the same or a different number of groups can be used as the number used to group the wafer-level parametric data in step 503. Further, even if the same number of groups is used, it should be noted that the grouping of die-level parametric data can be different from the grouping of die-level parametric data in the step 506.

In step 510 of the method 500, a representative value is determined for each of multiple groups of die-level parametric data created in step 509. The description above with respect to the step 204 also applies to the step 510.

In step 511 of the method 500, the wafer-level parametric data is arranged into the same number of groups as that into which the die-level parametric data was arranged in step 509. This can be done in the same manner as that in which die-level parametric data is arranged into groups in the step 506.

In step 512 of the method 500, a representative value is determined for each of multiple groups of wafer-level parametric data created in step 511. The description above with respect to the step 204 also applies to the step 512.

In step 513 of the method 500, a curve is fit to the data represented by the representative values of the wafer-level parametric data and die-level parametric data for each of specified groups of the parametric data determined in steps 510 and 512. The curve fit(s) can be produced in the same manner as that used to produce the curve fit(s) in the step 508. However, the number of curve fits and/or the groups used in the curve fit(s) can be different from that of the step 508.

In step 514 of the method 500, the curve fits determined in steps 508 and 513 are evaluated. The evaluation can be done in the same manner as described above with respect to the step 209 of the method 200. The additional grouping of the parametric data based on the values of the die-level parametric data advantageously provides an additional basis for evaluating the relationship between the wafer-level parameter and the die-level parameter.

Any of the above-described embodiments of the invention can be implemented so that none of the parametric data identified for use in evaluating the nature of the relationship between a wafer-level parameter and a die-level parameter is discarded prior to performing the evaluation. As discussed above, the use of all of the parametric data avoids inaccuracies in evaluation of the relationship between a die-level parameter and a wafer-level parameter that may arise from discarding parametric data.

The invention can be implemented, in whole or in part, by one or more computer programs and/or data structures, or as part of one or more computer programs and/or data structure (s), including instruction(s) and/or data for accomplishing the functions of the invention. For example, such computer program(s) and/or data structure(s) can include instruction (s) and/or data for selecting wafer regions for use in the yield analysis, determining wafer-level parametric data and die-level parametric data, grouping wafer-level parametric data and die-level parametric data, determining representative values for groups of wafer-level parametric data and die-level parametric data, fitting a curve to representative values for groups of parametric data, and evaluating a curve fit to determine the nature of the relationship between a wafer-level parameter and a die-level parameter. Those skilled in the art can readily implement the invention using one or more computer program(s) and/or data structure(s) in view of the description herein. Further, those skilled in the art can readily appreciate how to implement such computer program(s) and/or data structure(s) to enable execution on any of a variety of computational devices and/or using any of a variety of computational platforms.

Above, the invention has been described in detail as implemented to evaluate wafer-level parametric data and die-level parametric data to determine the nature of the relationship between a wafer-level parameter and a die-level parameter. However, generally, the invention can be implemented to evaluate parametric data representing any two parameters to determine the nature of the relationship between those parameters. More particularly, the invention can be implemented in accordance with the description above to evaluate parametric data representing two wafer-level parameters to determine the nature of the relationship between the two wafer-level parameters, or to evaluate parametric data representing two die-level parameters to determine the nature of the relationship between the two die-level parameters.

Various embodiments of the invention have been described. The descriptions are intended to be illustrative, not limitative. Thus, it will be apparent to one skilled in the art that certain modifications may be made to the invention as described herein without departing from the scope of the claims set out below.

I claim:

1. A method of analyzing the yield characteristics of a semiconductor process performed on one or more semiconductor wafers on each of which are formed one or more semiconductor die, comprising the steps of:

selecting, based on one or more characteristics of the one or more wafers, one or more regions of the one or more wafers from which to use wafer-level parametric data regarding a wafer-level parameter and die-level parametric data regarding a die-level parameter to ascertain information regarding the relationship between the wafer-level parameter and the die-level parameter, the one or more regions comprising less than all of the one or more wafers, wherein the step of selecting comprises the step of selecting one or more regions of the one or more wafers based on wafer sort data produced by one or more wafer sort tests performed on the one or more wafers, wherein the step of selecting based on wafer sort data comprises the steps of:

selecting a specified number of wafer regions that performed the worst on one or more wafer sort tests; and selecting the specified number of wafer regions that performed the best on one or more wafer sort tests;

identifying wafer-level parametric data from the one or more regions;

identifying die-level parametric data from the one or more regions that correspond to the water-level parametric data; and evaluating the wafer-level parametric data and the die-level parametric data to ascertain information regarding the relationship between the wafer-level parameter and the die-level parameter.

2. A method of analyzing the yield characteristics of a semiconductor process performed on one or more semiconductor wafers on each of which are formed one or more semiconductor die, comprising the steps of:

selecting, based on one or more characteristics of the one or more wafers, one or more regions of the one or more wafers from which to use wafer-level parametric data regarding a wafer level parameter and die-level parametric data regarding a die-level parameter to ascertain information regarding the relationship between the wafer-level parameter and the die-level parameter, the one or more regions comprising less than all of the one or more wafers, wherein the step of selecting comprises the step of selecting one or more regions of the one or more wafers based on wafer sort data produced by one or more wafer sort tests performed on the one or more wafers, wherein the step of selecting based on wafer sort data comprises the steps of:

selecting a first number of wafer regions including all wafer regions that performed at worse than a specified level on one or more wafer sort tests; and selecting a second number of wafer regions including wafer regions that performed the best on one or more wafer sort tests, wherein the second number is equal to the first number;

identifying wafer-level parametric data from the one or more regions;

identifying die-level parametric data from the one or more regions that correspond to the wafer-level parametric data; and evaluating the wafer-level parametric data and the die-level parametric data to ascertain information regarding the relationship between the wafer-level parameter and the die-level parameter.

3. A method of analyzing the yield characteristics of a semiconductor process performed on one or more semiconductor wafers on each of which are formed one or more semiconductor die, comprising the steps of:

selecting, based on one or more characteristics of the one or more wafers, one or more regions of the one or more wafers from which to use wafer-level parametric data regarding a wafer-level parameter and die-level parametric data regarding a die-level parameter to ascertain information regarding the relationship between the wafer-level parameter and the die-level parameter, the one or more regions comprising less than all of the one or more wafers, wherein the step of selecting comprises the step of selecting one or more regions of the one or more wafers based on wafer sort data produced by one or more wafer sort tests performed on the one or more wafers, wherein the step of selecting based on wafer sort data comprises the steps of:

selecting all wafer regions that performed at worse than a specified level on one or more wafer sort tests; and selecting all wafer regions that performed at better than a specified level on one or more wafer sort tests;

identifying wafer level parametric data from the one or more regions;

identifying die-level parametric data from the one or more regions that correspond to the wafer-level parametric data; and evaluating the wafer-level parametric data and the die-level parametric data to ascertain information regarding the relationship between the wafer-level parameter and the die-level parameter.

4. A method of analyzing the yield characteristics of a semiconductor process performed on one or more semiconductor wafers on each of which are formed one or more semiconductor die, comprising the steps of:

selecting, based on one or more characteristics of the one or more wafers, one or more regions of the one or more wafers from which to use wafer-level parametric data regarding a wafer-level parameter and die-level parametric data regarding a die-level parameter to ascertain information regarding the relationship between the wafer-level parameter and the die-level parameter, the one or more regions comprising less than all of the one or more wafers, wherein the step of selecting comprises the step of selecting one or more regions of the one or more wafers based on wafer sort data produced by one or more wafer sort tests performed on the one or more wafers, wherein the step of selecting based on wafer sort data comprises the steps of:

selecting a first set of wafer regions that performed the most poorly, based on one or more criteria, on one or more wafer sort tests; and selecting a second set of wafer regions that performed well, based on one or more criteria, on one or more wafer sort tests, wherein each wafer region of the second set of wafer regions corresponds to one and only one wafer region of the first set of wafer regions;

identifying wafer-level parametric data from the one or more regions;

identifying die-level parametric data from the one or more regions that correspond to the wafer-level parametric data; and evaluating the wafer-level parametric data and the die-level parametric data to ascertain information regarding the relationship between the wafer-level parameter and the die-level parameter.

5. A method as in claim 4, wherein a wafer region of the second set of wafer regions corresponds to a wafer region of the first set of wafer regions if the wafer region of the second set of wafer regions is located at a location on a second wafer that is the same as the location on a first wafer of the wafer region of the first set of wafer regions, the second wafer being different from the first wafer.

6. A method as in claim 4, wherein a wafer region of the second set of wafer region corresponds to a wafer region of the first set of wafer regions if the wafer region of the second set of wafer regions is located at a location on a wafer that is diametrically opposite the location on the wafer of the wafer region of the first set of wafer regions.

7. A method of analyzing the yield characteristics of a semiconductor process performed on one or more semiconductor wafers on each of which are formed one or more semiconductor die, comprising the steps of:

selecting, based on one or more characteristics of the one or more wafers, one or more regions of the one or more wafers from which to use wafer-level parametric data regarding a wafer-level parameter and die-level parametric data regarding a die-level parameter to ascertain information regarding the relationship between the wafer-level parameter and the die-level parameter, wherein the one or more regions comprise less than all of the one or more wafers;

identifying wafer-level parametric data from the one or more regions;

identifying die-level parametric data from the one or more regions that correspond to the wafer-level parametric data; and evaluating the wafer-level parametric data and the die-level parametric data to ascertain information regarding the relationship between the wafer-level parameter and the die-level parameter, wherein the step of evaluating comprises the steps of:

grouping some or all of the wafer-level parametric data into a first plurality of groups of wafer-level parametric data;

grouping some or all of the die-level parametric data into a first plurality of groups of die-level parametric data, wherein the die-level parametric data of each of the first plurality of groups of die-level parametric data corresponds to the wafer-level parametric data of one and only one of the first plurality of groups of wafer-level parametric data;

determining a representative value for the wafer-level parametric data of each of a second plurality of groups of wafer-level parametric data, wherein the second plurality of groups of wafer-level parametric data is the same as, or a subset of, the first plurality of groups of wafer-level parametric data;

determining a representative value for the die-level parametric data of each group of a second plurality of groups of die-level parametric data, wherein the second plurality of groups of die-level parametric data correspond to the second plurality of groups of wafer-level parametric data; and evaluating the relationship between the representative values for the groups of parametric data from the second pluralities of groups of die-level parametric data and wafer-level parametric data to ascertain information regarding the relationship between the wafer-level parameter and the die level parameter.

8. A method as in claim 7, wherein the step of identifying wafer-level parametric data comprises the step of performing a wafer level parametric test on the one or more regions to produce wafer-level parametric data.

9. A method as in claim 7, wherein the second plurality of groups of wafer-level parametric data comprises greater than 3 groups of wafer-level parametric data.

10. A method as in claim 7, wherein the step of grouping some or all of the wafer-level parametric data comprises the steps of:

ordering the wafer-level parametric data in increasing or decreasing order; and assigning a contiguous series of the ordered wafer-level parametric data to each of the first plurality of groups 11. A method as in claim 7, wherein the step of evaluating comprises the step of evaluating whether the value of the die-level parameter exhibits sensitivity to changes in the value of the wafer-level parameter.

12. A method as in claim 7, wherein the step of evaluating comprises the step of evaluating whether values of the wafer-level parameter that lie within wafer-level specification limits may cause the value of the die-level parameter to lie outside of die-level specification limits.

13. A method of analyzing the yield characteristics of a semiconductor process performed on one or more semiconductor wafers on each of which are formed one or more semiconductor die, comprising the steps of:

identifying a plurality of wafer-level parametric data regarding a wafer-level parameter;

identifying a plurality of die-level parametric data regarding a die-level parameter that correspond to the wafer-level parametric data; and evaluating the wafer-level parametric data and the die-level parametric data to ascertain information regarding the relationship between the wafer level parameter and the die-level parameter, wherein the step of evaluating comprises:

grouping some or all of the plurality of wafer-level parametric data into a first plurality of groups of wafer-level parametric data based on the values of the wafer-level parametric data;

grouping some or all of the plurality of die-level parametric data into a first plurality of groups of die-level parametric data, wherein the die-level parametric data of each of the first plurality of groups of die-level parametric data corresponds to the wafer-level parametric data of one and only one of the first plurality of groups of wafer-level parametric data;

determining a representative value for the wafer-level parametric data of each of a plurality of the first plurality of groups of wafer-level parametric data;

determining a representative value for the die-level parametric data of each group of the first plurality of groups of die-level parametric data that corresponds to a group of the first plurality of groups of wafer-level parametric data for which a representative value was determined;

grouping some or all of the plurality of die-level parametric data into a second plurality of groups of die level parametric data based on the values of the die-level parametric data;

grouping some or all of the plurality of wafer-level parametric data into a second plurality of groups of wafer-level parametric data, wherein the wafer-level parametric data of each of the second plurality of groups of wafer-level parametric data corresponds to the die-level parametric data of one and only one of the second plurality of groups of die-level parametric data;

determining a representative value for the die-level parametric data of each of a plurality of the second plurality of groups of die-level parametric data;

determining a representative value for the wafer-level parametric data of each group of the second plurality of groups of wafer-level parametric data that corresponds to a group of the second plurality of groups of die level parametric data for which a representative value was determined; and evaluating the relationship between the representative values for the groups of parametric data from the first plurality of groups of die-level parametric data and wafer-level parametric data, and the relationship between the representative values for the groups of parametric data from the second plurality of groups of die-level parametric data and wafer-level parametric data to ascertain information regarding the relationship between the wafer-level parameter and the die-level parameter.

14. A method as in claim 13, wherein:

the step of grouping some or all of the plurality of wafer-level parametric data into a first plurality of groups of wafer-level parametric data comprises the steps of:

ordering the wafer-level parametric data in increasing or decreasing order; and assigning a contiguous series of the ordered wafer-level parametric data to each of the first plurality of groups of wafer-level parametric data; and the step of grouping some or all of the plurality of die-level parametric data into a second plurality of groups of die-level parametric data comprises the steps of:

ordering the die-level parametric data in increasing or decreasing order; and assigning a contiguous series of the ordered die-level parametric data to each of the second plurality of groups of die-level parametric data.

15. A method as in claim 13, further comprising the step of selecting, based on one or more characteristics of the one or more wafers, one or more regions of the one or more wafers from which to use wafer-level parametric data and die-level parametric data, wherein the one or more regions comprise less than all of the one or more wafers.

16. A method as in claim 13, wherein each of the first and second pluralities of groups of parametric data comprises greater than 3 groups of parametric data.

17. A method of analyzing the yield characteristics of a semiconductor process performed on one or more semiconductor wafers on each of which are formed one or more semiconductor die, comprising the steps of:

identifying a plurality of wafer-level parametric data regarding a wafer-level parameter;

identifying a plurality of die-level parametric data regarding a die-level parameter that correspond to the wafer-level parametric data; and evaluating the wafer-level parametric data and the die-level parametric data to ascertain information regarding the relationship between the wafer-level parameter and the die-level parameter, wherein the step of evaluating comprises:
  grouping some or all of the plurality of wafer-level parametric data or the plurality of die-level parametric data into a first plurality of groups of parametric data;
  grouping some or all of the other of the plurality of wafer-level parametric data or the plurality of die-level parametric data into a second plurality of groups of parametric data, wherein the die-level parametric data of each group of die level parametric data corresponds to the wafer-level parametric data of one and only one of the plurality of groups of wafer-level parametric data;
  determining a representative value for the parametric data of each of greater than 3 of the first plurality of groups of parametric data;
  determining a representative value for the parametric data of each group of the second plurality of groups of parametric data that corresponds to a group of the first plurality of groups of parametric data for which a representative value was determined; and
  evaluating the relationship between the representative values for the plurality of groups of die-level parametric data and the plurality of groups of wafer-level parametric data to ascertain information regarding the relationship between the wafer-level parameter and the die-level parameter.

18. A method as in claim 17, wherein the step of determining a representative value for the parametric data of each of greater than 3 of the first plurality of groups comprises determining a representative value for the parametric data of 6 of the fist plurality of groups.

19. A method as in claim 17, wherein the step of determining a representative value for the parametric data of each of greater than 3 of the first plurality of groups comprises determining a representative value for the parametric data of 9 of the first plurality of groups.

20. A method as in claim 17, further comprising the step of selecting, based on one or more characteristics of the one or more wafers, one or more regions of the one or more wafers from which to use wafer-level parametric data and die-level parametric data, wherein the one or more regions comprise less than all of the one or more wafers.

21. A method of analyzing the yield characteristics of a semiconductor process performed on one or more semiconductor wafers on each of which are formed one or more semiconductor die, comprising the steps of:
  identifying a plurality of wafer-level parametric data regarding a wafer-level parameter;
  identifying a plurality of die-level parametric data regarding a die level parameter that correspond to the wafer-level parametric data; and
  evaluating all of the identified wafer-level parametric data and the identified die-level parametric data to ascertain information regarding the relationship between the wafer-level parameter and the die-level parameter, wherein the step of evaluating comprises the steps of:
    grouping the wafer-level parametric data into a plurality of groups of wafer-level parametric data;
    grouping the die-level parametric data into a plurality of groups of die-level parametric data, wherein the die-level parametric data of each of the plurality of groups of die-level parametric data corresponds to the wafer-level parametric data of one and only one of the plurality of groups of wafer-level parametric data;
    determining a representative value for the wafer-level parametric data of each of the plurality of groups of wafer level parametric data;
    determining a representative value for the die-level parametric data of each of the plurality of groups of die-level parametric data; and
    evaluating the relationship between the representative values for the plurality of groups of die-level parametric data and the plurality of groups of wafer-level parametric data to ascertain information regarding the relationship between the wafer-level parameter and the die-level parameter.

22. A method as in claim 21, wherein each of the pluralities of groups of parametric data comprises greater than 3 groups of parametric data.

23. A method as in claim 21, further comprising the step of selecting, based on one or more characteristics of the one or more wafers, one or more regions of the one or more wafers from which to use wafer-level parametric data and die-level parametric data, wherein the one or more regions comprise less than all of the one or more wafers.

* * * * *